(12) United States Patent
Ito

(10) Patent No.: US 7,294,952 B2
(45) Date of Patent: Nov. 13, 2007

(54) LAMINATED-TYPE PIEZOELECTRIC ELEMENT AND INKJET RECORDING HEAD HAVING THE SAME

(75) Inventor: Atsushi Ito, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 394 days.

(21) Appl. No.: 11/126,620

(22) Filed: May 11, 2005

(65) Prior Publication Data

US 2005/0253488 A1 Nov. 17, 2005

(30) Foreign Application Priority Data

May 11, 2004 (JP) ............................ P2004-141389

(51) Int. Cl.
*B41J 2/045* (2006.01)
(52) U.S. Cl. ...................... 310/364; 310/365; 310/366; 347/70; 347/71; 347/72
(58) Field of Classification Search ........ 310/363–366; 347/68–71
See application file for complete search history.

(56) References Cited

U.S. PATENT DOCUMENTS

| | | | |
|---|---|---|---|
| 6,595,628 B2 | 7/2003 | Takagi et al. | |
| 6,846,069 B2* | 1/2005 | Ito et al. ......................... | 347/71 |
| 6,854,833 B2* | 2/2005 | Ito ............................... | 347/68 |
| 6,932,463 B2* | 8/2005 | Ito ............................... | 347/68 |
| 6,955,420 B2* | 10/2005 | Ito ............................... | 347/71 |
| 7,004,576 B2* | 2/2006 | Ito ............................... | 347/93 |
| 7,073,894 B2* | 7/2006 | Isono et al. .................... | 347/68 |
| 7,168,792 B2* | 1/2007 | Ito ............................... | 347/71 |
| 2003/0210307 A1* | 11/2003 | Ito et al. ........................ | 347/71 |
| 2003/0218659 A1* | 11/2003 | Ito ............................... | 347/71 |
| 2004/0090499 A1* | 5/2004 | Ito ............................... | 347/68 |
| 2005/0264618 A1* | 12/2005 | Ito ............................... | 347/71 |
| 2006/0023034 A1* | 2/2006 | Ito et al. ........................ | 347/71 |
| 2006/0158487 A1* | 7/2006 | Ito et al. ........................ | 347/71 |
| 2007/0052780 A1* | 3/2007 | Mizutani et al. ............... | 347/93 |
| 2007/0103524 A1* | 5/2007 | Ito ............................... | 347/92 |

FOREIGN PATENT DOCUMENTS

JP 2002-254634 9/2002

* cited by examiner

*Primary Examiner*—J. San Martin
(74) *Attorney, Agent, or Firm*—Reed Smith LLP

(57) ABSTRACT

A laminated-type piezoelectric element includes first electrode layers defining individual electrodes, second electrode layers defining common electrodes, and piezoelectric sheets sandwiched between the first and second electrode layers. The first and second electrode layers are laminated alternately. Each individual electrode has a substantially rectangle shape extending in a first direction. The individual electrodes defined in each first electrode layer are arranged at predetermined intervals in a second direction perpendicular to the first direction, to form a row. The common electrode includes a first portion having a band shape. The first portion overlaps the row when viewed in a plan view. The first portion has a pair of edges extending to be perpendicular to a long side of the rectangle shape of each individual electrode. Both ends of each individual electrode in the first direction protrude to outer positions than the edges, when viewed in the plan view.

15 Claims, 11 Drawing Sheets

LAMINATED-TYPE PIEZOELECTRIC ELEMENT AND INKJET RECORDING HEAD HAVING THE SAME

BACKGROUND OF THE INVENTION

1. Field of the Invention

The present invention relates to a laminated-type piezoelectric element and an inkjet recording head having the same.

2. Description of the Related Art

Conventionally, a piezoelectric element has been used as a driving source (piezoelectric actuator) used for various types of devices with utilizing its characteristics of converting electric energy into mechanical displacement (deformation) by piezoelectric effects.

Of the piezoelectric elements, a piezoelectric element, which is formed into a laminated type in order to increase a deformation amount due to distortion, has the following structure. Individual electrodes and common electrodes are formed on one surface (one broad surface) of a piezoelectric sheet made of ceramic material such as PZT (lead zirconate titanate) by the screen printing method with using conductive material such as conductive paste. Piezoelectric sheets having the common electrodes and piezoelectric sheets having the individual electrodes are laminated alternately.

An on-demand type inkjet recording head has been proposed as an example of a device using the laminated-type piezoelectric element. As disclosed in U.S. Pat. No. 6,595,628, a cavity unit having a plurality of plates laminated includes a plurality of pressure chambers arranged in two parallel rows. A piezoelectric actuator serving as a laminated-type piezoelectric element having active portions (energy generating means) corresponding to each pressure chamber is joined to the cavity unit. Upon applying voltage to each active portion of the piezoelectric actuator, ink is selectively ejected from nozzles arranged in rows.

In this case, as disclosed in U.S. Pat. No. 6,595,628, the laminated-type piezoelectric element having two rows of the nozzles and active portions corresponding to the nozzles is formed by alternately laminating ceramic green sheets (piezoelectric sheets) made of piezoelectric material having individual electrodes on one surface thereof (broad surface) and other ceramic piezoelectric sheets having common electrodes on one surface thereof (broad surface), and then baking the laminated piezoelectric sheets.

The structure of the piezoelectric element disclosed in U.S. Pat. No. 6,595,628 will be described in more detail. As shown in FIG. 10, it is assumed that on a nozzle plate 100 having a shorter side in a first direction (X direction) and a longer side in a second direction (Y direction), rows of a plurality of nozzles 101 arranged in rows along the second direction (Y direction) are formed in tow rows in a zigzag manner while sandwiching a center line passing a center thereof in the short-side direction and extending in the second direction. The individual electrodes 103, which are formed on the broad surface (upper surface) of the lowermost piezoelectric sheets 102 in a laminated direction and on the broad surfaces of the odd-numbered sheets 102 of the piezoelectric sheets as counted from the lowermost piezoelectric sheets 102 upwardly, have a rectangle shape in plan view, which elongates in the first direction and is narrow in the second direction. The individual electrodes 103 are arranged in a zigzag manner in the second direction at the same intervals as the nozzles 101. One edges 103a of the individual electrodes 103 are located on both sides of the central line of the piezoelectric sheet 102. The other edges of each individual electrodes 103 in the X direction extend to an edge of a longer side of the piezoelectric sheet 102. It is assumed that each individual electrode 103 has a length L1 in the longitudinal direction Also, a long dummy common electrode 104 is formed in the vicinity of an edge of a short side of each piezoelectric sheet 102 along the short side.

Meanwhile, as shown in FIG. 10, a common electrode 106 formed on a broad surface (upper surface) of each of the even-numbered piezoelectric sheets 105 in the laminated direction has a length L2 in the short side direction (first direction) of the piezoelectric sheet 15, on a center side. The common electrode 106 has a band shape extending in the second direction. Each of long sides 106a, 106a on both sides of the common electrode 106 are distant by a length L3 from an edge of the long side of the piezoelectric sheet 105. Also, extraction portions 107 extending along an edge of the short side of the piezoelectric sheet 105 are integrally formed with the common electrode 106 in the vicinity of the short side. Also, on both sides of the common electrode 106, dummy individual electrodes 109 are located apart from the sides 106a and 106a appropriately and extend to the edge of each long side of the piezoelectric sheet 105.

When the piezoelectric sheets 102 and 105 are laminated alternately, each dummy individual electrode 109 partially overlaps each individual electrode 103 corresponding thereto as viewed in a plan view in the laminated direction. Likewise, the dummy common electrode 104 is also located to overlap the extraction portion 107.

When the plurality of piezoelectric sheets 102 and 105 are laminated alternately, a portion where each individual electrode 103 and each common electrode 106 overlap each other in the laminated direction defines an active portion. Meanwhile, through-holes 110 for electrically connecting the individual electrodes 103 each other in the laminated direction via electrically conductive materials are defined through the piezoelectric sheets 102 except for the lowermost one, at positions of the individual electrode 103 and dummy individual electrode 109 in the vicinity of the long side edge of each piezoelectric sheet 102. Similarly, through-holes 111 for electrically connecting the common electrodes 106 each other via electrically conductive materials are defined through the piezoelectric sheets 105 at positions of the extraction portion 107 and the dummy common electrode 104 in the vicinity of the short side of each piezoelectric sheet 105.

Each of the individual electrodes 103, the common electrodes 106, the dummy individual electrodes 109, and the dummy common electrodes 104 are formed by applying electrically conductive paste of, e.g., Ag—Pd (silver-palladium) system by the screen printing method to the piezoelectric sheets (green sheets) 102 and 105, and then baking them. Accordingly, as shown in FIG. 11, the length L4 of each active portion is equal to a projected length between a long side 106a of the band-shape common electrode 106 and the one side 103a of the individual electrode 103 located on upper or lower side of the piezoelectric sheet 102(105) interposed therebetween. That is, the length of each active portion is determined by the one side 103a of the individual electrode 103 and the long side 106a of the common electrode 106 with the piezoelectric sheets 102(105) interposed therebetween.

SUMMARY OF THE INVENTION

However, even though the individual electrode 103 and the common electrode 106 are manufactured to have patterns without positional deviances in the X direction during the screen printing, if the piezoelectric sheet 102 having the individual electrode 103 and the piezoelectric sheet 105 having the common electrode 106 laminated on each other are deviated to the X direction on a plane perpendicular to the laminated direction, it is not possible to accurately set the length L4 of the active portions. For example, when six layers of piezoelectric sheets 102(105) are laminated, relative positional deviances take place at six positions (six positions having deviant tolerance) between the long side 106a of the common electrode 106 and the side 103a in the middle of the short side of the individual electrode 103. That is, a problem arises in that since a variation in the length L4 of the active portions corresponding to the x direction length of each pressure chamber 112 shown in FIG. 11, that is, an tolerance (a difference between the maximum and minimum allowable values) is increased, a variation in electrostatic capacitance of the piezoelectric sheet 102(105) interposed therebetween is also increased and causes a variation in ink ejecting speed from the nozzle upon applying activating voltage. This results in poor quality of the recording head and screen recording of each product.

The invention has been made to solve the above-mentioned problems, and provides a laminated-type piezoelectric element stabilized by a simple structure and an inkjet recording head having the same.

According to one embodiment of the invention, a laminated-type piezoelectric element includes a plurality of first electrode layers, a plurality of second electrode layers, and a plurality of piezoelectric sheets. The first electrode layers and the second electrode layers are laminated alternately. Each of the piezoelectric sheets is sandwiched between the first electrode layer and the second electrode layer. Each of the first electrode layers defines a plurality of individual electrodes. Each of the individual electrodes defined in one of the first electrode layers is electrically connected to counterpart individual electrodes of the others of the first electrode layers. The second electrode layers are electrically connected to each other. Each of the individual electrodes has an elongated and substantially rectangle shape extending in a first direction. The individual electrodes defined in each first electrode layer are arranged at predetermined intervals in a second direction perpendicular to the first direction, to form a row. A common electrode defined in each second electrode layer includes a first portion having a band shape, the first portion extending to overlap the row of the individual electrodes when viewed in a plan view. The first portion of the common electrode has a pair of edges extending to be perpendicular to a long side of the rectangle shape of each individual electrode. The individual electrodes and the common electrodes at least partially overlap each other in a laminated direction, when viewed in the plan view. Both ends of each individual electrode in the first direction protrude to outer positions than the pair of edges of the first portion, when viewed in the plan view.

According to this structure, when the pair of edges of the first portion are laminated on a single piezoelectric sheet, a length of each individual electrode in the first direction on other adjacent piezoelectric sheet is longer than a length between the pair of edges (the length in the first direction). Accordingly, when the piezoelectric sheets are alternately laminated, the length of the active portion in the first direction is uniquely defined by the length between the pair of edges in a state where the individual electrode and the common electrode overlap each other. Therefore, a tolerance (a difference between the maximum and minimum allowable values) of the first-direction length in the plurality of active portions overlapping in a laminated direction in which the piezoelectric sheets are laminated is determined only by deviation of the piezoelectric sheets having the common electrodes in the first direction when the sheets are laminated, Accordingly, compared to U.S. Pat. No. 6,595,628, a deviation in length or electrostatic capacitance of the active portion can be decreased.

According to one embodiment of the invention, an inkjet recording head includes a cavity unit and a laminated-type piezoelectric element. The cavity unit includes a plurality of nozzles and a row of pressure chambers. The nozzles are arranged to form a row extending in a second direction. The row of the nozzles is arranged in a first direction perpendicular to the second direction. The pressure chambers correspond to the nozzle. The piezoelectric element is joined to a rear face of the cavity unit. The piezoelectric element includes a plurality of first electrode layers, a plurality of second electrode layers, and a plurality of piezoelectric sheets. The first electrode layers and the second electrode layers are laminated alternately. Each of the piezoelectric sheets is sandwiched between the first electrode layer and the second electrode layer. Each of the first electrode layers defines a plurality of individual electrodes. Each of the individual electrodes defined in one of the first electrode layers is electrically connected to counterpart individual electrodes of the others of the first electrode layers. The second electrode layers are electrically connected to each other. Each of the individual electrodes has an elongated and substantially rectangle shape extending in the first direction. The individual electrodes defined in each first electrode layer are arranged at predetermined intervals in the second direction to form a row. A common electrode defined in each second electrode layer includes a first portion having a band shape, the first portion extending to overlap the row of the individual electrodes when viewed in a plan view. The first portion of the common electrode of each second piezoelectric sheet has a pair of edges extending to be perpendicular to a long side of the rectangle shape of each individual electrode. The individual electrodes and the common electrodes at least partially overlap each other in a laminated direction, when viewed in the plan view. Both ends of each individual electrode in the first direction protrude to outer positions than the pair of edges of the first portion, when viewed in the plan view.

According to this structure, if the inkjet recording head is manufactured with using such a laminated-type piezoelectric element, a deviation in ink eject speed from nozzles is decreased when the same activating voltage is applied to, resulting in a stabilization in quality of a recording head and in print quality.

According to one embodiment of the invention, a laminated-type piezoelectric element includes a first electrode layer, a second electrode layer and a piezoelectric sheet. The first electrode layer defines a plurality of individual electrodes. The second electrode layer defines a common electrode. The piezoelectric sheet is sandwiched between the first electrode layer and the second electrode layer. Each of the individual electrodes has an elongated and substantially rectangle shape extending in a first direction. The individual electrodes are arranged at predetermined intervals in a second direction perpendicular to the first direction, to form a row. The common electrode includes a band-shape portion extending in the second direction to overlap the row of the individual electrodes when viewed in a plan view. The band-shape portion of the common electrode has a pair of edges extending in the second direction. Both ends of each individual electrode in the first direction protrude to outer positions than the pair of edges of the band-shape portion, when viewed in the plan view.

DETAILED DESCRIPTION OF THE PREFERRED EMBODIMENTS

Hereinafter, preferred embodiments of the invention will be described with reference to the accompanying drawings.

An inkjet recording head for color print according to this embodiment includes a head unit 1 mounted on a carriage (not shown) reciprocating in a direction (main-scanning direction, hereinafter referred to as a first direction or X direction) perpendicular to a paper conveyance direction (sub-scanning direction, hereinafter referred to as a second direction or Y direction). Ink cartridges filled with four color inks including, for example, cyan, magenta, yellow, and black inks, respectively, are detachably mounted in the head unit 1. Alternately, each color ink is supplied from each ink cartridge mounted on a main body of an image forming device through a supply pipe (not shown) and a damper chamber (not shown) mounted on the carriage.

Figure 1:
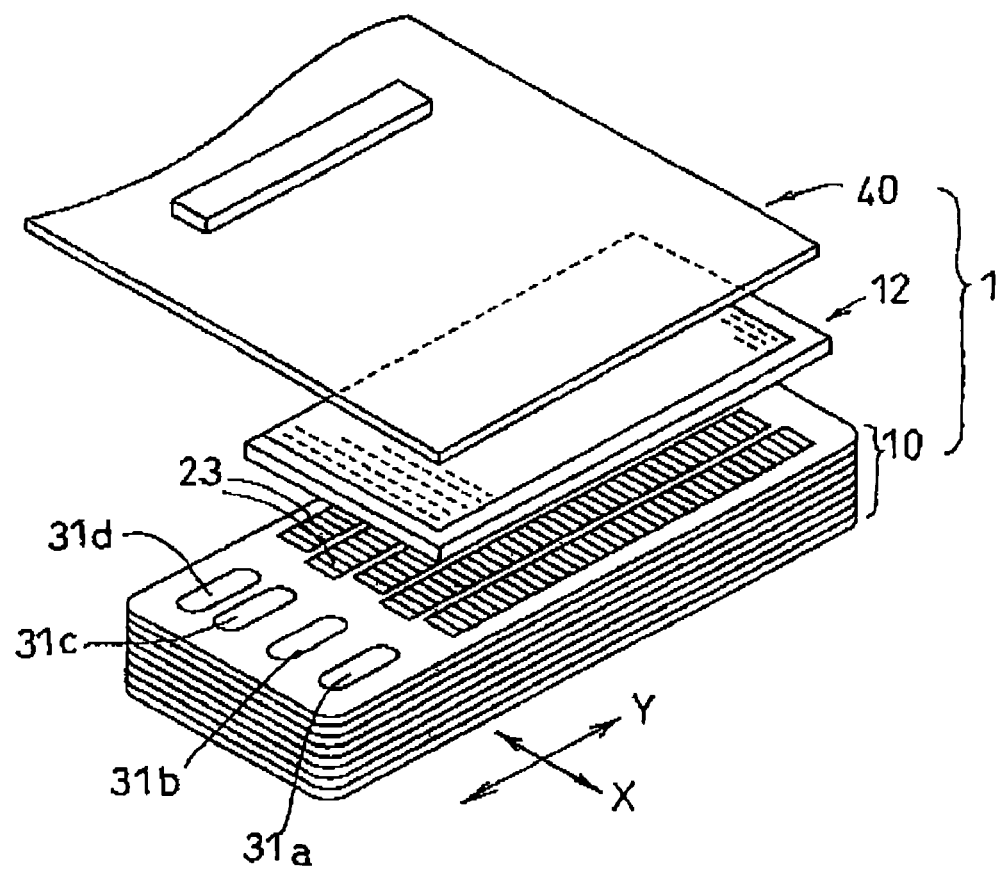
FIG. 1 is an exploded perspective view showing a cavity unit, a piezoelectric actuator, and a flat cable constituting a piezoelectric inkjet recording head according to a first embodiment of the invention.
Figure 2:
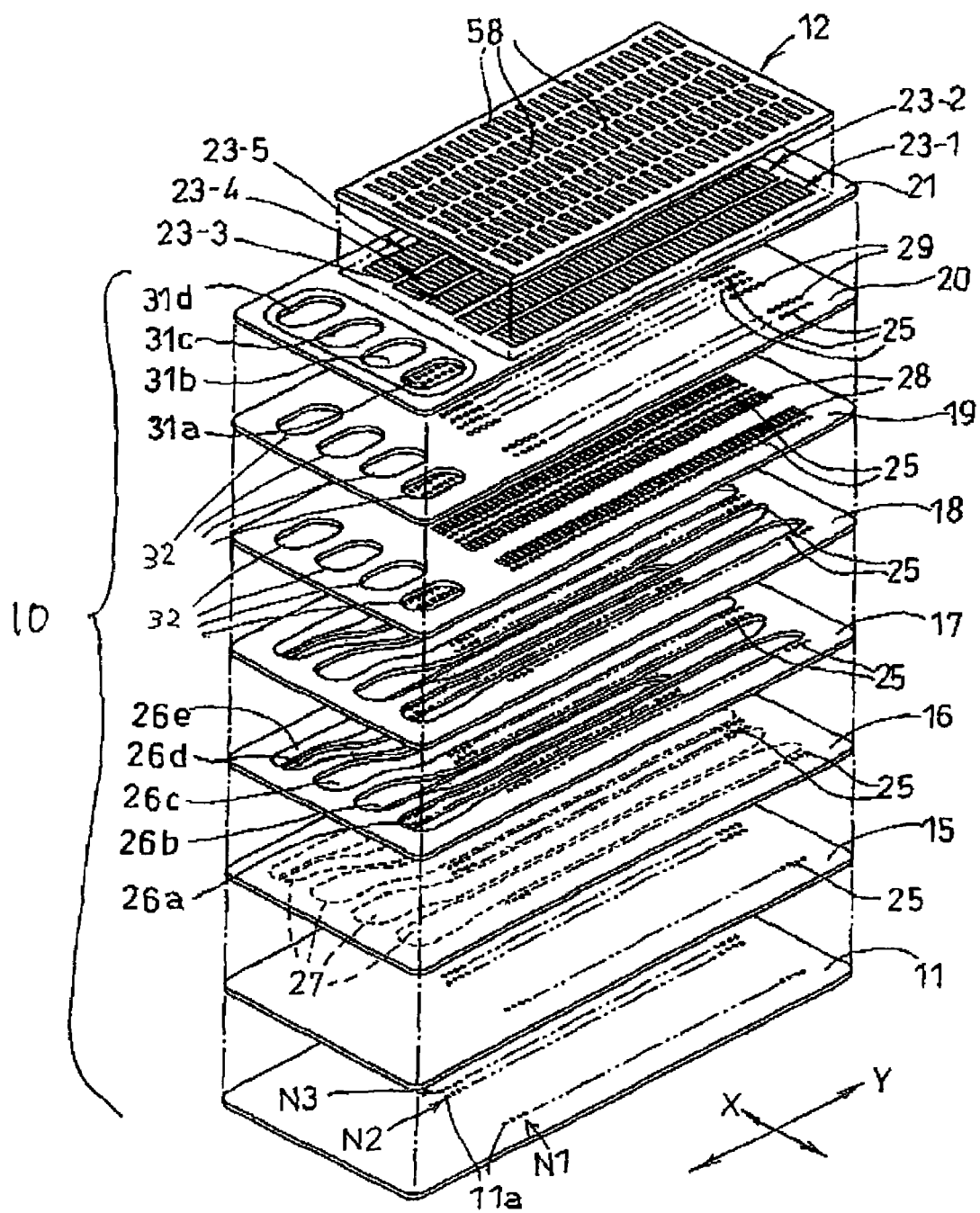
FIG. 2 is an exploded perspective view of the cavity unit.

As shown in FIG. 2, the head unit 1 includes a cavity unit 10, a plate-type piezoelectric actuator 12, and a flexible flat cable 40. The cavity unit 10 has a plurality of nozzles 11a (see FIG. 2), which are. arranged in the Y direction (second direction) on the front face thereof (lower surface in FIG. 2). The rows of the nozzles 11a (five parallel rows of the nozzles 1a in this embodiment) are arranged at proper intervals in the x direction. The piezoelectric actuator 12 are laminated and bonded on the cavity unit 10 through an adhesive agent or an adhesive sheet. The flexible flat cable 40 is an example of a wiring substrate superposed and bonded on the rear face (upper surface) of the piezoelectric actuator 12, for electrical connection with external devices.

The cavity unit 10 is configured as shown in FIG. 2. That is, the cavity unit 10 is configured so that a laminar structure 12 including a total of 8 plates laminated on each other and bonded with an adhesive agent. The plates include a nozzle plate 11, a cover plate 15, a damper plate 16, two manifold plates 17 and 18, two spacer plates 19 and 20, and abase plate 21 defining pressure chambers 23, in order from the lowermost layer. Each of the plates 15 to 21 other than the nozzle plate 11 made of a synthetic resin are made of a nickel alloy steel including 42% of nickel and have a thickness of about 50 μm to 150 μm.

Each of the nozzles 11a for ejecting inks, defined in the nozzle plate 11, has an minute diameter (about 25 μm in this embodiment). The nozzles 11a are arranged in a zigzag manner in the second direction of the nozzle plate 11 (longitudinal direction of the cavity unit 10, and Y direction or sub-scanning direction in FIG. 2). Also, five parallel rows N (designated by N1 to N5, where N4 and N5 are not shown) of the nozzles 11 are arranged at predetermined intervals in the X direction (main-scanning direction). In this embodiment, each of the rows N of nozzles, i.e. the first to fifth rows, has a length of 1 inch and includes seventy five (75) nozzles 11a, i.e. the array density is 75 dpi (dot per inch).

In FIG. 2, when reference numerals N1 to N5 (N4 and N5 are not shown) are sequentially assigned to the rows of nozzles from the right side, the nozzle row N1 is for a cyan ink (C), N2 is for a yellow ink (Y), N3 is for a magenta ink (M), and N4 and N5 are for a black ink (BK).

Ink passages extending in the Y direction are defined in the manifold plates 17 and 18 to correspond to each of the nozzle rows N1 to N5 and pass therethrough in a thickness direction. The manifold plates 17 and 18 are interposed between the first spacer plate 19 and the damper plate 16 and laminated on each other, whereby the ink passages form five rows of common ink chambers (manifold chambers) 26. In FIG. 2, when reference numerals 26a, 26b, 26c, 26d, and 26eare sequentially assigned to the common ink chambers from the right side, the common ink chamber 26a is for a cyan ink (C), the common ink chamber 26b is for a yellow ink (Y), the common ink chamber 26c is for a magenta ink (M), and the forth and fifth common ink chambers 26d and 26eare for a black ink (BK).

In FIG. 2, when reference numerals 31a, 31b, 31c, and 31d are sequentially assigned from the right side to four ink supply holes defined in one end of the base plate 21 in the Y direction at predetermined intervals, the ink supply holes 31a, 31b, and 31c correspond to the common ink chambers 26a, 26b, and 26c sequentially from the right side, and the fourth ink supply hole 31d from the right side commonly corresponds to end portions of the two common ink chambers 26d and 26eadjacent to each other. As shown in FIG. 2, ink passages 32 defined at end portions of the second spacer plate 20 and the first spacer plate 19 so as to correspond to the ink supply holes 31a, 31b, and 31c communicate with end portions of corresponding common ink chambers 26a, 26b, and 26c, respectively.

Also, in a lower surface side of the damper plate 16 attached to a lower surface of the manifold plate 17, damper chambers 27 extending in Y direction are recessed to be opened downwardly, at positions corresponding to the common ink chambers 26. The cover plate 15 surely closes the lower surface of the damper plate 16, thereby forming completely and hermetically sealed damper chambers 27.

According to this structure, of a pressure wave acting on the pressure chambers 23 by the activation of the piezoelectric actuator 12, a backward component transmitted through ink toward the common ink chamber 26 is absorbed by oscillation of ceiling portions of the thin damper chambers 27, thereby preventing crosstalk.

Figure 3:
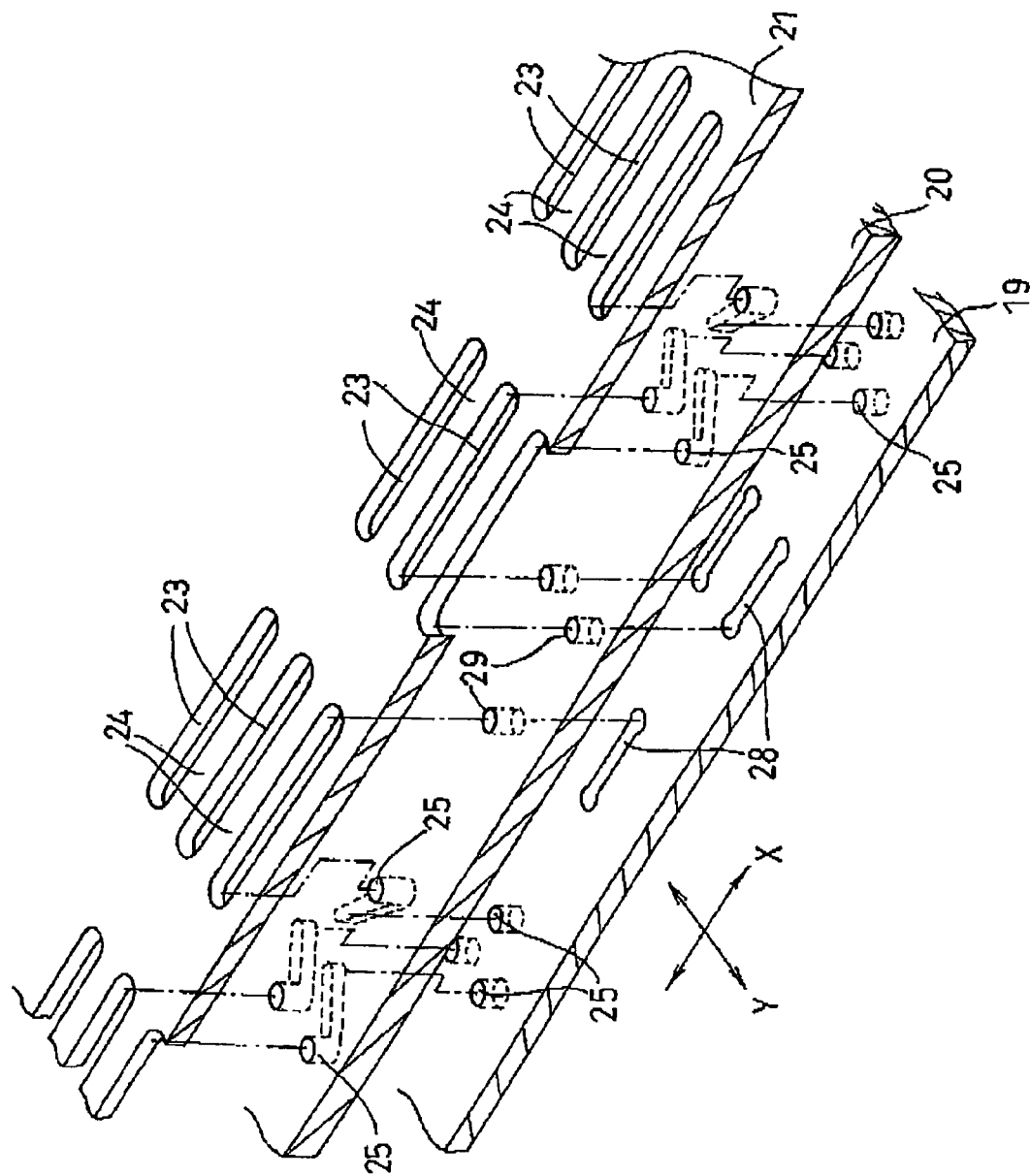
FIG. 3 is a partially exploded perspective view of the cavity unit.

Flow restricting portions 28 corresponding to the nozzle 11a of the nozzle rows N1 to N5 are recessed in the first spacer plate 19 to be relatively long in the X direction and short in the Y direction. One ends of the flow restricting portions 28 communicate with the corresponding common ink chambers 26a to 26e defined in manifold plate 18, and the other ends thereof communicate with communication holes 29 defined in the second spacer plate 20 to pass therethrough, as described below (see FIG. 3).

Communication passages 25 communicating with the nozzles 11a of the nozzle rows N1 to N5 are defined to pass through the cover plate 15, the damper plate 16, the two manifold plates 17 and 18, and the first and second spacer plates 19 and 20 at positions, which do not overlap the common ink chambers 26 and the damper chambers 27.

Also, pressure chambers (rows of the pressure chambers are denoted by reference numerals 23-1, 23-2, 23-3, 23-4, and 23-5, respectively), which have a narrow width and extend in the X direction, are defined in the base plate 21 to pass therethrough. Number of the pressure chambers 23 corresponds to that of the nozzles 11a. One end of each pressure chamber 23 in the longitudinal direction (X direction) communicates with the other end of each flow restricting portions 28 defined in the first spacer plate 19 through the communication hole 29 defined to pass through the second spacer plate 20. The other end of each pressure chamber 23 in the longitudinal direction communicates with each communication passage 25 defined to pass through the second spacer plate 20. The rows of pressure chambers 23 are arranged in Y direction with partition walls 24 interposed therebetween. The pressure chambers 23 are arranged to deviate by half pitch from pressure chambers 23 in the adjacent row, that is, are arranged in a zigzag manner.

In this way, ink flowing into each common ink passages 26 from each ink supply hole 31a to 31d is distributed to each pressure chamber 23 through the flow restricting portions 28 and the communication holes 29. Then the ink is delivered from the pressure chambers 23 to the nozzles 11a corresponding to the pressure chambers 23 through the communication passages 25.

Next, a structure of the piezoelectric actuator 12 will now be described. As described in detail later, the piezoelectric actuator 12 has a piezoelectric sheet between electrodes 36 and 37, as an active portion. The common electrodes 36 and the individual electrodes 37 sandwich the piezoelectric sheets in a laminated direction to be opposed to each other. In other words, the cavity unit 11 includes plural first electrode layers each defining individual electrodes 37, plural second electrode layers each defining a common electrode 36, and plural piezoelectric sheets. The first and second electrode layers are laminated alternately. Each of the piezoelectric sheets is sandwiched between the first electrode layer and the second electrode layer, As known in the art, the active portion is formed by applying high voltage between the individual electrode 36 and the common electrode 37 and polarizing the piezoelectric sheet therebetween. When voltage is applied between an individual electrode 36 and a common electrode 37 in a direction parallel to the polarizing direction, an active portion of a piezoelectric sheet corresponding to the individual electrode 36 to which the voltage is applied is deformed in the laminated direction due to the piezoelectric effects. The number of active portions is the same as that of the pressure chambers 23. The active portions are formed at positions corresponding to the rows of pressure chambers 23.

That is, the active portions form rows in the row direction (the second direction, Y direction) of the nozzles 11a (the pressure chamber 23), respectively. The rows of the active portions are arranged in the first direction (X direction) so as to have the same number as that of the nozzle rows (five rows). Also, each active portion elongates in the longitudinal direction of the pressure chamber 23, that is, the first direction (the widthwise direction of the cavity unit 10, X direction). Arrangement intervals between adjacent active portions in the Y direction are identical with those between the pressure chambers 23 to be described later and are arranged in a zigzag manner like the pressure chambers 23.

The active portions of the piezoelectric actuator 12 are schematically shown in FIG. 2 and designated by reference numeral 58. Although the active portions 58 should be shown by dotted lines, for the purpose of simplicity, the active portions 58 are shown by solid lines.

Figure 4:
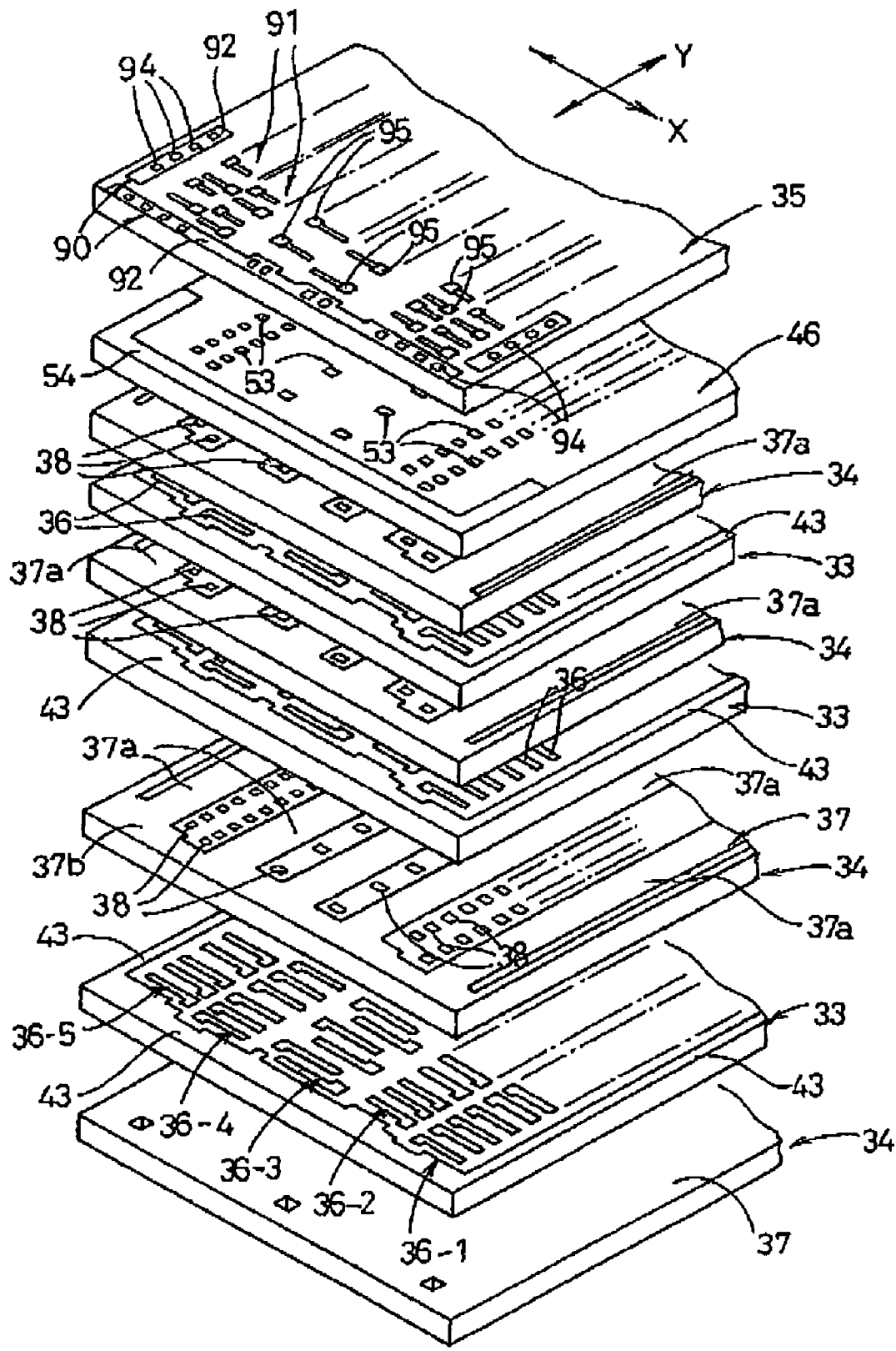
FIG. 4 is a partially cutaway exploded perspective view of the piezoelectric actuator.

As shown in FIG. 4, the piezoelectric actuator 12 has a laminar structure including a group in which a plurality of piezoelectric sheets 33 and 34 (seven piezoelectric sheets in this embodiment) made of a piezoelectric ceramic plate having a thickness of about 30 μm are alternately laminated on each other; a restriction layer formed of a single sheet 46 laminated on the group; and a top sheet 35, which is a surface sheet, laminated on the restriction layer. The restriction layer and top sheet maybe a piezoelectric ceramic plate or other material so long as they have electric insulation.

Figure 5:
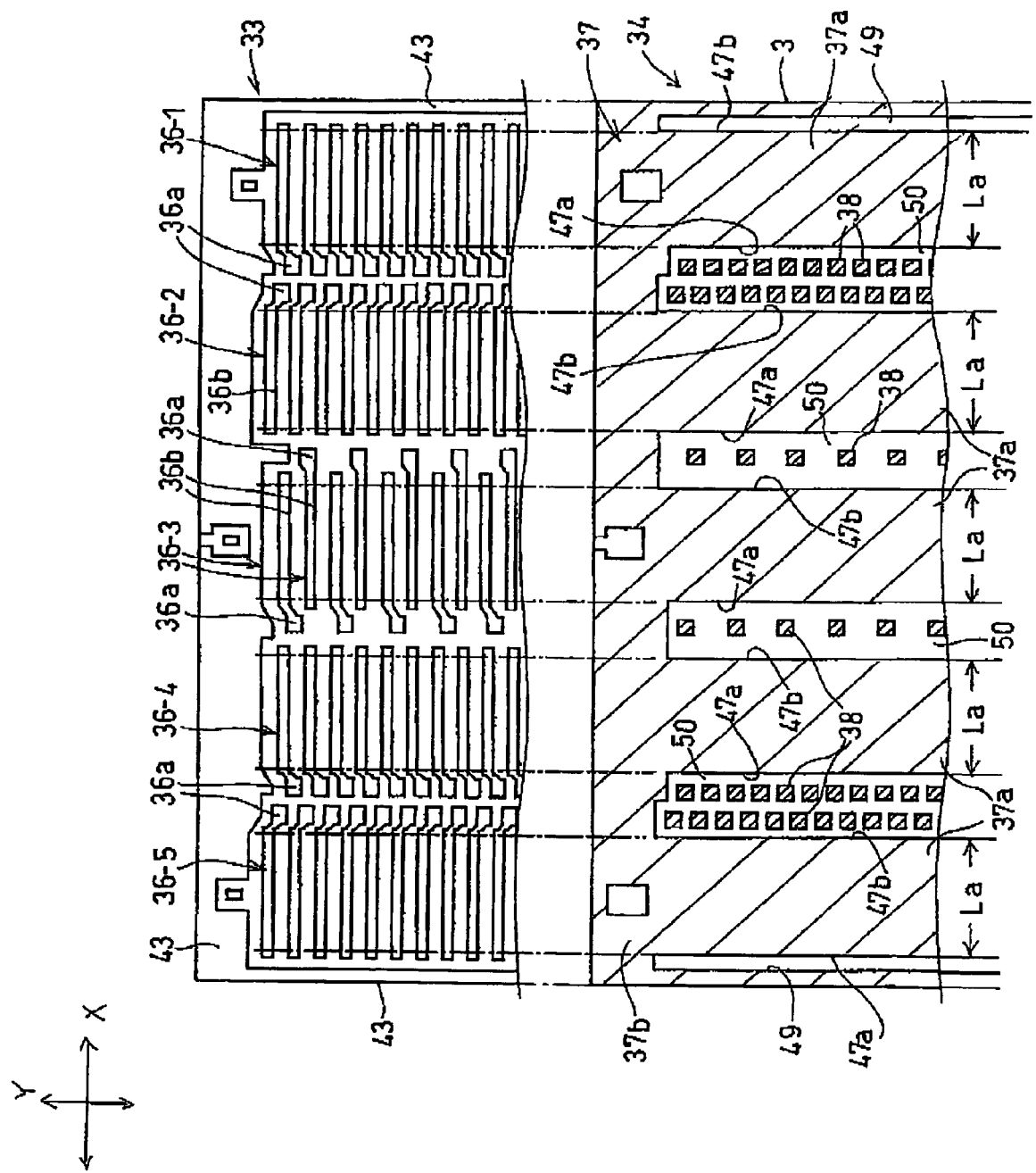
FIG. 5 is a partially cutaway plan view showing a piezoelectric sheet having individual electrodes and a piezoelectric sheet having a common electrode while arranging those piezoelectric sheets in a first direction.
Figure 6:
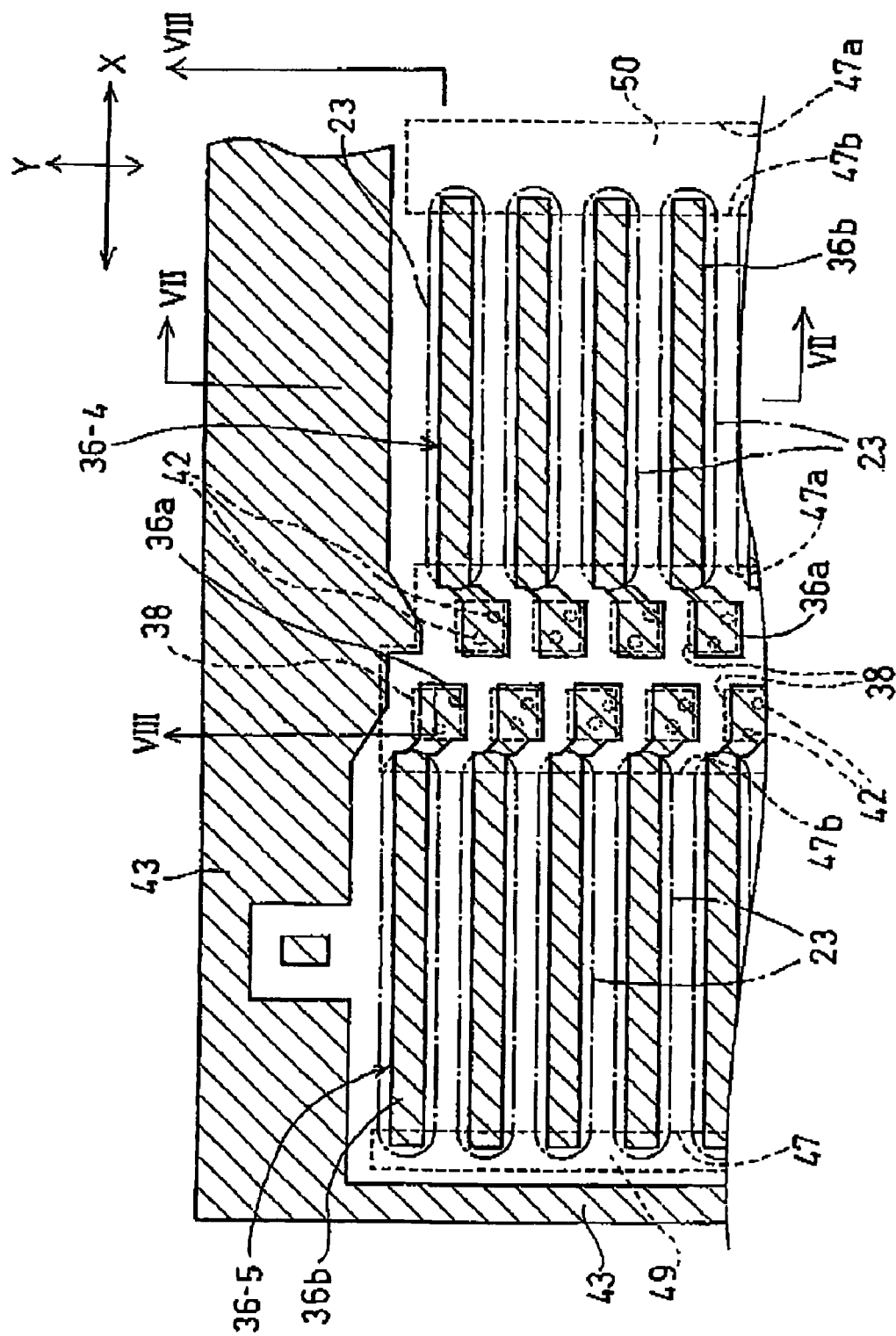
FIG. 6 is a partially cutaway plan view showing the individual electrodes and the common electrodes laminated on each other.

As shown in FIGS. 4, 5 and 6, on an upper surface (flat surface) of each even-numbered piezoelectric sheet 33 as counted from the bottom, narrow individual electrodes 36 are formed by screen printing at positions just above the corresponding pressure chambers 23 defined in the cavity unit 11 so that the individual electrodes 36 are arranged in the second direction (the longitudinal direction of the piezoelectric sheet 33, Y direction in FIG. 2, and the row direction of the nozzles 11a) to form rows. Five rows of the individual electrodes 33 are arranged in X direction.

As shown in FIGS. 4 and 5, the first to fifth rows (denoted by reference numerals 36-1, 36-2, 36-3, 36-4, and 36-5, respectively, in FIG. 4) of the individual electrodes 36 are formed on an upper surface of each piezoelectric sheet 33 to correspond to the first to fifth rows 23-1, 23-2, 23-3, 23-4 and 23-5 of the pressure chambers 23. A pattern of each individual electrode 36 includes a straight portion 36b of a straight shape having a length approximately equal to that of each pressure chamber 23 (see dashed lines in FIG. 6) and narrower width than that of each pressure chamber 23, that is, the straight portion 36b having a rectangle shape elongating in X direction and being narrower in Y direction. The individual electrodes 36 are arranged to overlap the pressure chambers 23 as viewed in plan view.

As shown in FIGS. 5 and 6, one end portion 36a (i.e. terminal) of each individual electrode 36 is formed to be bent with respect to the straight portion 36b and to extend out of the pressure chamber 23 in plan view. Also, one end portions 36a of the third individual electrodes 36-3 extend in opposite directions from the pressure chamber 23 alternately with respect to a row direction (Y direction) of the individual electrodes 36.

Also, dummy common electrodes 43 are formed on outer peripheral portions along the short and long sides of the broad surface of the piezoelectric sheet 33. The dummy common electrodes 43 partially overlap the common electrodes 37 on the piezoelectric sheets 34 in plan view (see hatched portions shown in FIGS. 4, 5, and 6).

The common electrode 37 is formed by screen printing on a front face (upper surface) of each of the lowermost piezoelectric sheet 34 and even-numbered piezoelectric sheets 34 as counted from the lowermost one (see FIG. 4).

The common electrode 37 on the lowermost piezoelectric sheet 34 is entirely formed on the upper surface thereof. On each of the other upper piezoelectric sheets 34, the common electrode 37 overlaps arrangement positions of the rows 36-1 to 36-5 of the individual electrodes corresponding to the rows 23-1 to 23-5 of the pressure chambers in plan view, and includes first electrically conductive portions 37a and second electrically conductive portions 37b (see the hatched portion in FIG. 5). Each first electrically conductive portion 37a has a band shape elongating in Y direction along the long side of the piezoelectric sheet 34. The second electrically conductive portions 37b elongate in X direction along the short side of the piezoelectric sheet 37 and connect with both end of the first electrically conductive portions 37a. In this embodiment, five parallel rows of the first electrically conductive portions 37a having a strip shape are arranged to correspond to the number of rows of the individual electrodes 36. As shown in FIG. 5, each of the first electrically conductive portions 37a has a pair of edges 47a and 47b elongating to be perpendicular to a longitudinal side of each individual electrode 36 having the rectangle shape. A distance between the pair of edges 47a and 47b is set to La.

In addition, in this embodiment, as shown in FIG. 5, blank portions 49 (portions where an electrically conductive paste is not printed) having a narrow strip shape (a rectangle shape in plan view) are formed at positions adjacent to the two outermost first electrically conductive portions 37a in X direction. Similarly, four blank portions 50 having a rectangle shape of a slightly wider width in plan view are formed between the adjacent first electrically conductive portions 37a, to be parallel to the blank portions 49. Further, a plurality of dummy individual electrodes 38 having a island shape are formed in the blank portions 50 at positions overlapping the terminals 36a of the individual electrodes 36 in plan view. Accordingly, the pair of edges 47a and 47b of each first electrically conductive portion 37a are defined by edges (boundary lines) of the blank portions 49 extending in the Y direction and edges (boundary lines), of the blank portion 50 extending in the Y direction, thereby determining the length La between the pair of edges 47a and 47b.

As shown in FIG. 6, when the piezoelectric sheets 33 and 34 are laminated, each individual electrode 36 and each first electrically conductive portion 37a in each common electrode 37 overlap in the sheet laminated direction. Both ends of each individual electrode 36 in the first direction (X direction) protrude more outwardly (X direction) than the pair of edges 47a and 47b of the first electrically conductive portion 37a. The length La between the pair of edges 47a and 47b defines (preset) a length of each active portion in the first direction.

Figure 8:
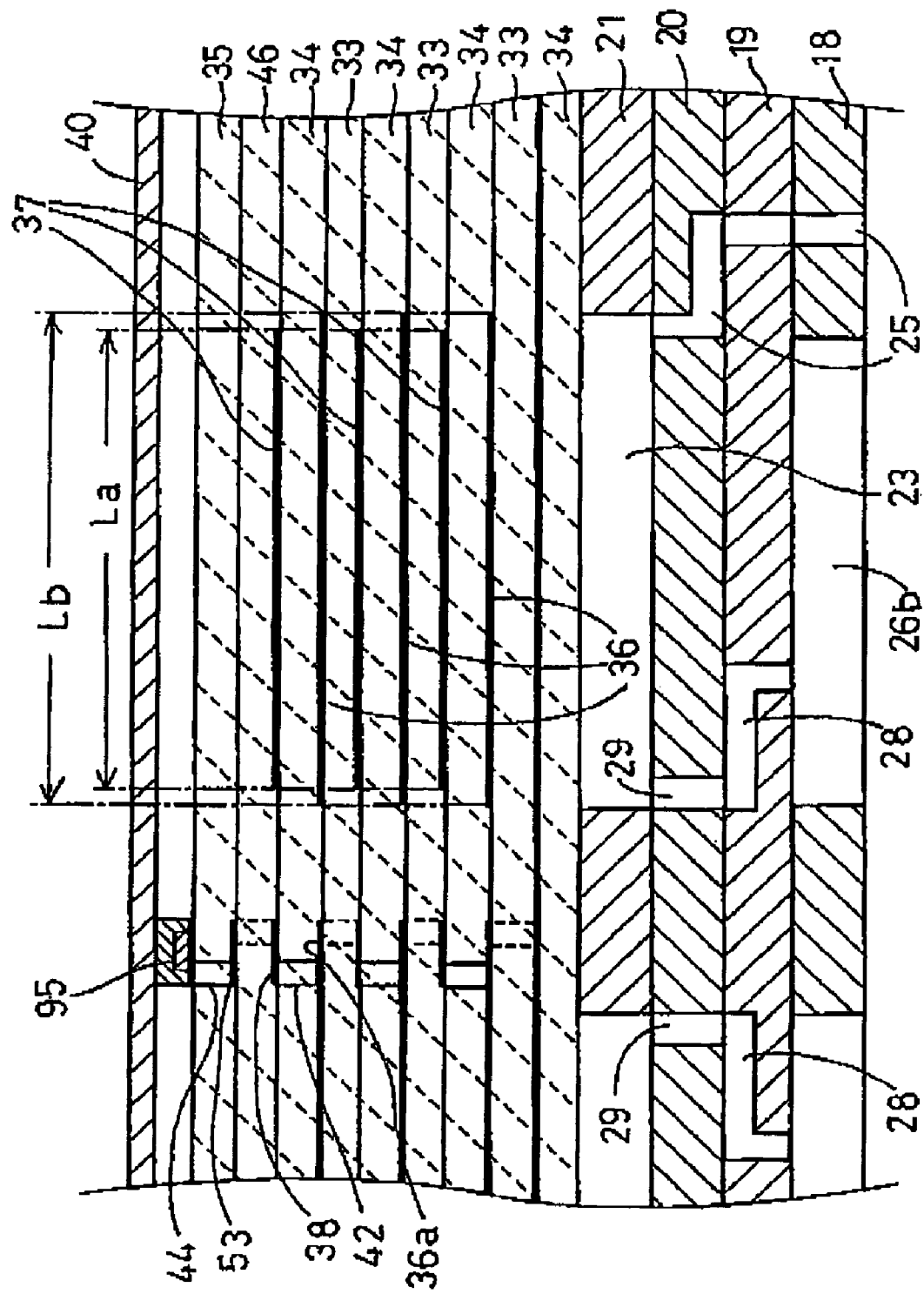
FIG. 8 is an enlarged cross-sectional view taken along the line VIII-VIII of FIG. 6.

That is, when the pair of edges 47a and 47b of each first. electrically conductive portion 37a having the band shape in each common electrode 37 are formed in a single piezoelectric sheet 34, the length Lb of each individual electrode 36 of an adjacent piezoelectric sheet 33 in the X direction is longer than the length La between the pair of edges 47a and 47b. Therefore, when the piezoelectric sheet 33 is laminated on the piezoelectric sheet 34, a length of the active portion in X direction is uniquely defined by the length La between the pair of edges 47a and 47b in a state where the individual electrodes 36 and the first electrically conductive portions 37a overlap each other (see FIG. 8). Accordingly, in this embodiment, a tolerance length (a difference between the maximum and minimum allowable values) in X direction among three active portions overlapping in the sheet laminated direction defined by three piezoelectric sheets 34 except the lowermost one and the piezoelectric sheets 33 laminated therebetween is determined only by deviation of the three piezoelectric sheets 34 in X direction when laminated. Accordingly, compared to U.S. Pat. No. 6,595,628, a deviation in lengths or electrostatic capacitances of the active portions is decreased, thereby reducing a deviation in ink eject speed from nozzles when the same activating voltage is applied. This leads to stabilization in quality of a recording head and in print quality. Also, it is possible to accurately form the length (the length in X direction) of the active portion corresponding to each individual electrode 36 with such a simple configuration that the first electrically conductive portions 37a of the band shape are formed as many as number of rows of the individual electrodes 36.

Also, since width of each individual electrode 36 in the Y direction is narrower than the length thereof in the X direction, it is possible to accurately and simply form the plurality of active portions at short intervals in the Y direction.

Also, at least one of the pair of edges 47a, 47b of each first electrically conductive portion 37a is formed to be a boundary between the common electrode and a rectangle blank portion. Accordingly, when the plurality of first electrically conductive portions 37a are formed on a surface of the piezoelectric sheet 34, unnecessary portions maybe formed into blank portions 49, 50 where electrical material is not used, whereby it is possible to easily form the common electrodes.

Also, as shown in FIG. 5, in this embodiment, in a row arranged at the center in the short-side direction of the piezoelectric sheet 33 among five rows of the individual electrodes 36 arranged in the X direction, one individual electrode 36 and another individual electrode 36 adjacent to the one individual electrode 36 in the second direction (Y direction) alternately protrude at their end portions 36a serving as terminals to opposite sides from the pair of edges 47a and 47b of the common electrode 37. Each end portion 36a is arranged to overlap in the laminated direction (in plan view) at least a portion of each dummy common electrode 38 of the island shape arranged at regular intervals in the blank portion 50.

As described above, each individual electrode 36 includes at one end thereof the terminal 36a protruding from one of the edges 47a, 47b of the first electrically conductive portion 47 when viewed in the plan view. The terminal 36a are electrically connected to another individual electrode 36 in the laminated direction. Accordingly, in order to stack the plurality of piezoelectric sheets 33, 34 and electrically connect the individual electrodes 36 in the laminated direction so that corresponding active portions can be formed, internal conductive electrodes described later have only to be formed in a through-hole shape at a position of the terminal, thereby simplifying structure thereof.

Also, two individual electrodes 36 adjacent to each other in the Y direction include the terminals 36a protruding from the edges 47a, 47b of the first electrically conductive portion 47 in opposite directions alternately, when viewed in the plan view. Accordingly, the terminals 36a adjacent to each other in the Y direction can be arranged in a zigzag manner, whereby the individual electrodes 36 in the laminated direction can be electrically connected easily without a short circuit.

As shown in FIG. 4, on an upper surface of the upper sheet 46 serving as the restriction layer, connection patterns 53 having a rectangle shape in plan view are arranged at regular intervals to overlap at least a portion of each dummy individual electrode 38 of the piezoelectric sheet 34 in plan view. Also, in portions along a short side of the upper surface of the upper sheet 46, communicating patterns 54 serving as common conductive portions are formed to overlap a part of the common electrode 37 of the piezoelectric sheet 34 and a part of the dummy common electrode 43 of the piezoelectric sheet 33 in plan view.

In order to electrically connect the common electrode 37 and the dummy common electrode 43 each other in an up and down direction at plural positions, in the piezoelectric sheets 34, 33 and the upper sheet 46 except for the lowermost piezoelectric sheet 34, internal conductive electrodes (not shown) are formed by filling electrically conductive elements (electrically conductive paste) in a plurality of through-holes defined at positions of the second electrically conductive portion 37b and the dummy common electrode 43 to pass through the piezoelectric sheets 34, 33 in the thickness direction.

Figure 7:
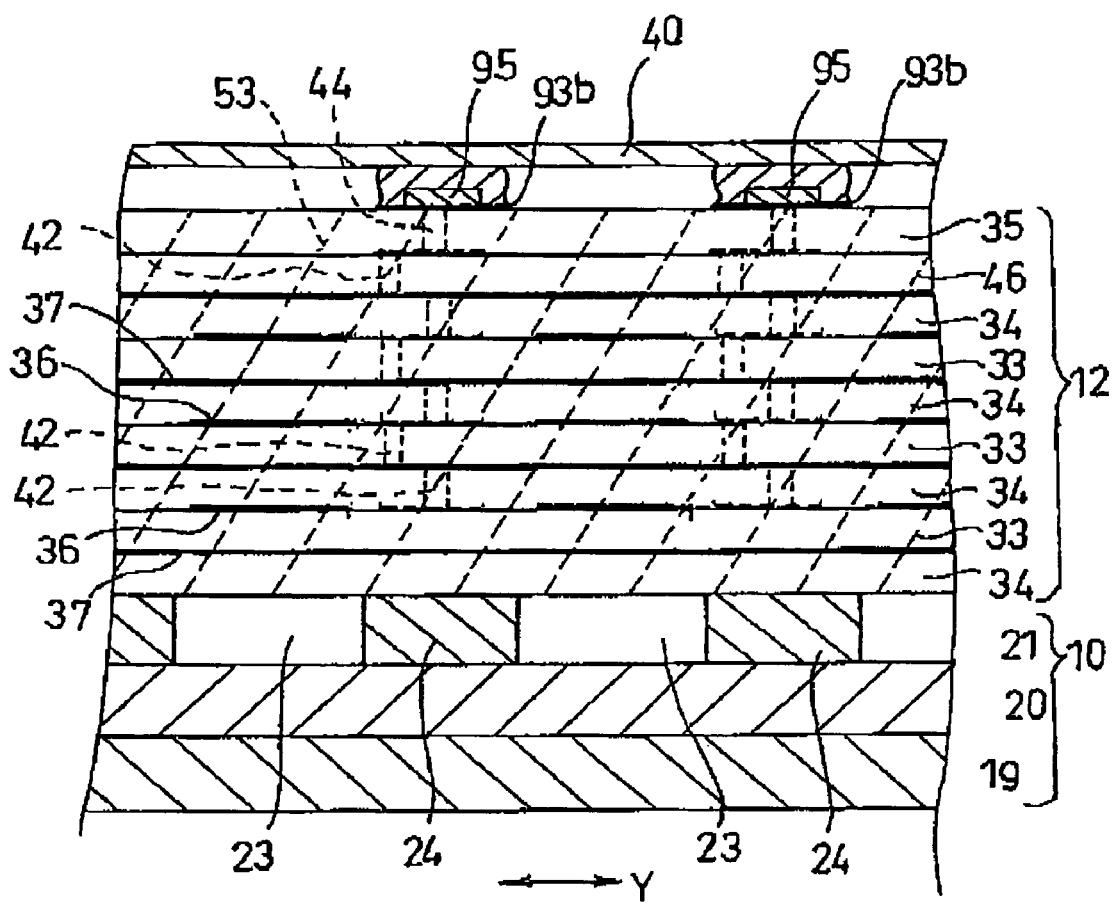
FIG. 7 is an enlarged cross-sectional view taken along the line VII-VII of FIG. 6.

Similarly, in order to electrically and connect the individual electrodes 36, the dummy individual electrodes 38, and the communicating patterns 54 each other in the up and down direction, at the end portions 36a of each individual electrode 36 of the plurality of piezoelectric sheets 33, each dummy individual electrode 38 of the piezoelectric sheets 34, and the communicating patterns 54 of the upper sheet 46, internal conductive electrodes 42 are formed by filling electrically conductive elements (electrically conductive paste) in a plurality of through-holes defined to pass through the piezoelectric sheets 33, 34 and 46. In this case, the internal conductive electrodes 42 are formed to be separate from each other so that that the internal conductive electrodes 42 of the adjacent respective piezoelectric sheets 33, 34, 46 do not overlap each other in the up and down direction in plan view (see FIGS. 6 and 7).

Figure 9:
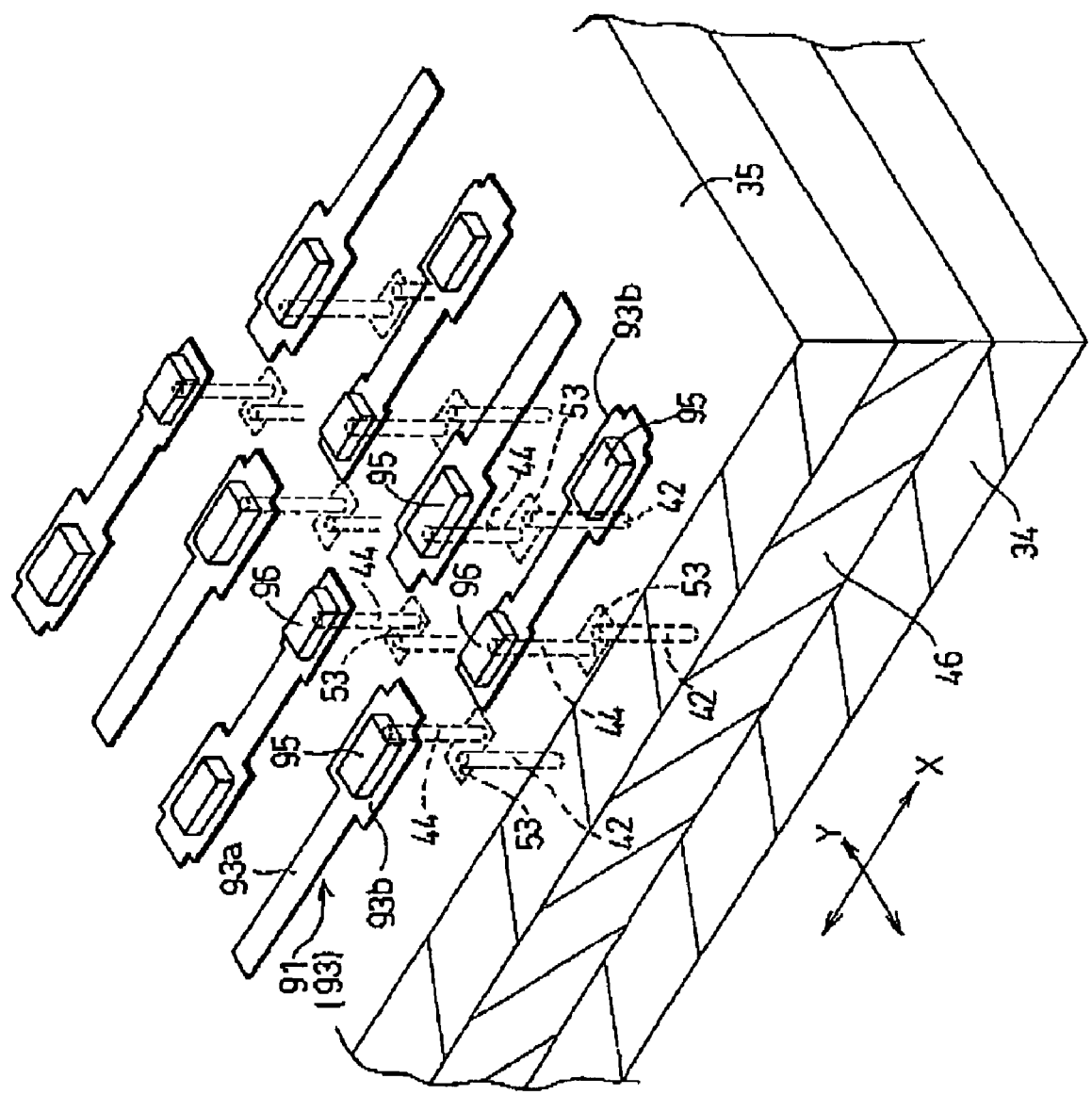
FIG. 9 is a partially enlarged perspective view showing arrangement of connection terminals for individual electrodes on a surface of a top sheet.
Figure 10:
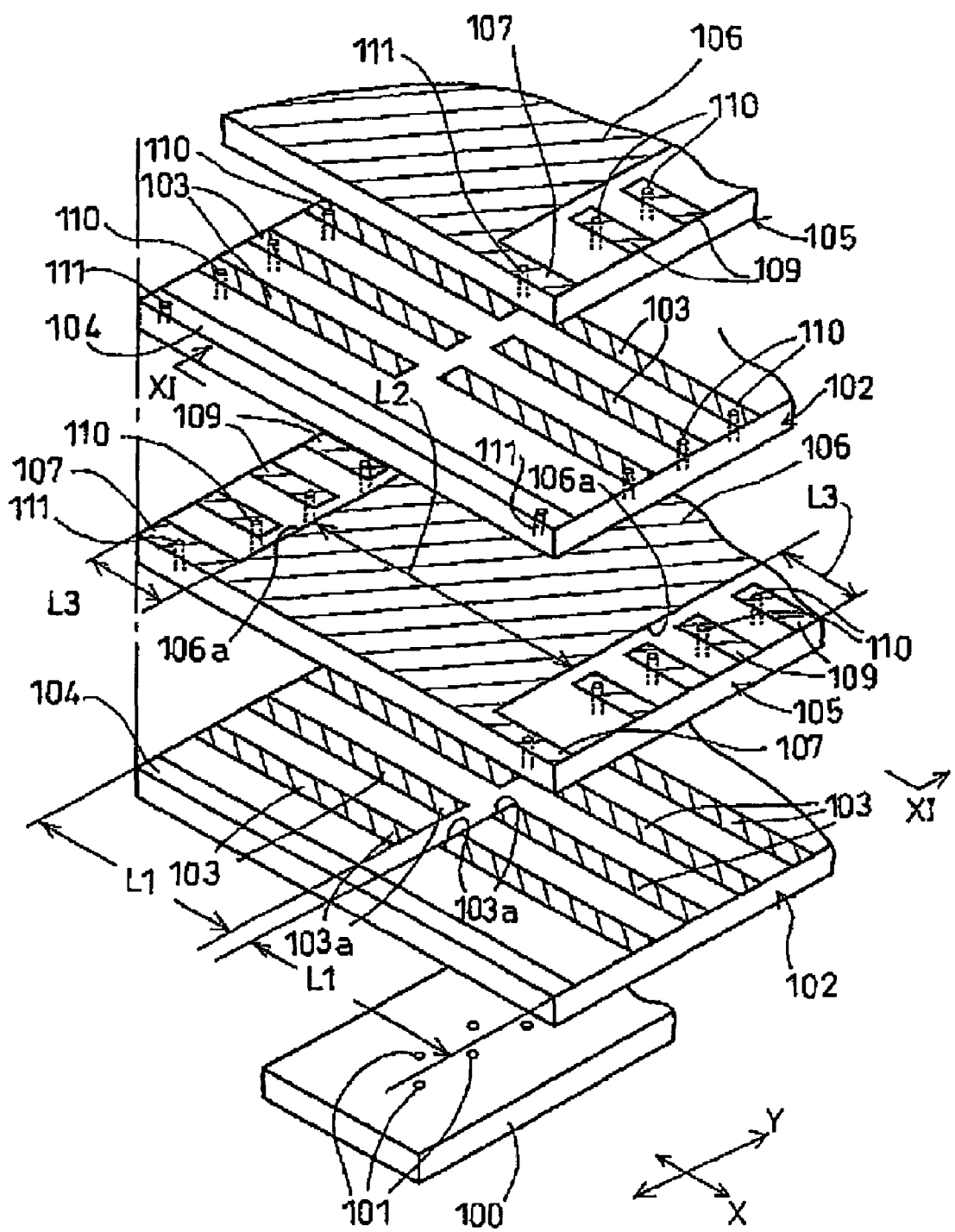
FIG. 10 is a partially perspective view showing a positional relation between an individual electrode and a common electrode in U.S. Pat. No. 6,595,628.
Figure 11:
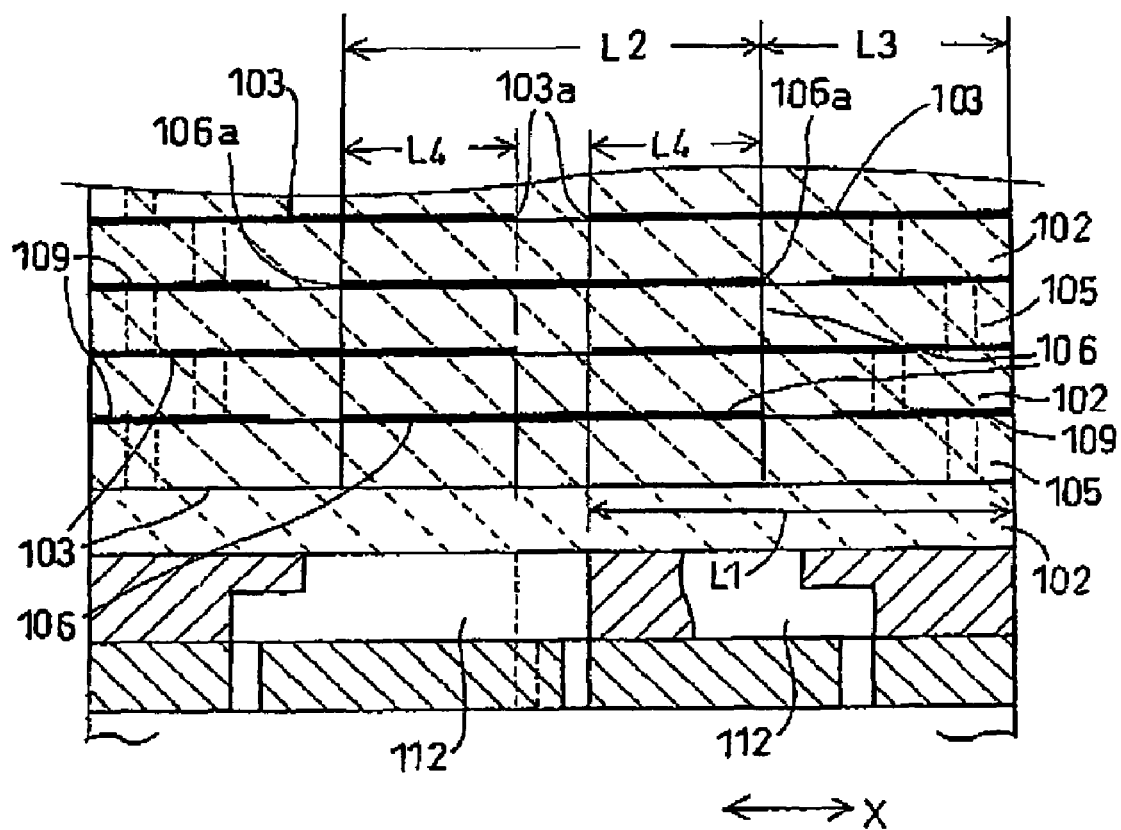
FIG. 11 is an enlarged cross-sectional view taken along the line XI-XI of FIG. 10.

As shown in FIGS. 4 and 9, on an upper surface of the top sheet 35 serving as the uppermost surface sheet of the piezoelectric actuator 12, connection terminals (connection electrodes) 90 for common electrode connection and connection terminals (connection electrodes) 91 for individual electrode connection are formed in an island shape. The connection terminals 90, 91 are connected to bump electrodes for common electrode connection (not shown) and bump electrodes for individual electrode connection (not shown), which are formed is on a lower surface of the flexible flat cable 40, respectively.

The connection terminals 90 and 91 include thin surface electrodes 92(93) formed on a surface of a top sheet 35 and thick external electrodes 94(95) formed on surfaces of the surface electrodes 92(93) (only the surface electrode 93 is shown in FIG. 9). In order to electrically connect the connection terminals 90 and 91 on the top sheet 35 with the communicating pattern 54 and connection pattern 53 on corresponding upper sheet 46 in the up and down direction, internal conductive electrodes 44 are formed by filing electrically conductive elements (electrically conductive paste) in a plurality of through-holes defined to pass through the top sheet 35, in a similar manner to that described above.

Also, the thin surface electrodes 92 of the connection terminals 90 for common electrode connection are arranged to overlap at least a portion of the communicating pattern 54 of the upper sheet 46 in plan view, and are formed in a band shape at a peripheral portion of the upper surface of the top sheet 35 (see FIG. 4). Also, the thick external electrodes 94 having appropriately shapes are arranged to be attached later on the surface of the surface electrode 92.

The surface electrodes 92(93), the individual electrodes 36, the common electrodes 37, the dummy individual electrodes 38, the dummy common electrodes 43, the internal conductive electrodes 42, 44 filled in the through-holes, the connection patterns 53, and the communicating patterns 54 are formed by screen printing on a surface of a green sheet, which is the raw material of the piezoelectric sheets 33, 34, the upper sheet 46, and the top sheet 35, with using Ag—Pd based conductive material (electrically conductive paste), then laminating the piezoelectric sheets 33 and 34, the upper sheet 46 and the top sheet 35 in a predetermined order, and further baking them. The Ag—Pd based conductive material is not evaporated even when the green sheet is baked at high temperatures since it is very high in melting point. However, Ag—Pd based conductive material is not joined very well to a soldering alloy.

The external electrode 94(95) are formed by printing on a surface of the surface electrode 92(93) with using silver-glass frit based conductive paste for thick film after the baking and then baking at a temperature lower than the above-mentioned baking temperature. Although the silver-glass frit based conductive material has low melting point but well in joint capability to the soldering alloy in comparison with the Ag—Pd based conductive material. Accordingly, since the external electrode 94(95) is formed on a surface of the surface electrode 92(93), the connection terminals 90 and 91 are joined better to the bump electrodes of the flexible flat cable 40, in comparison with a case where the external electrode 94(95) is not formed.

Also, in the embodiment shown in FIG. 9, the external electrodes 95 are alternately formed on one end portion and the other end portion of the connection terminals 91 arranged in the Y direction. At portions where the external electrodes 95 are not formed on the internal conductive electrodes 44, filling electrodes 96 for filling upper portions of the inner conductive electrodes 44 containing the through holes thereof are formed.

While the five parallel rows of the nozzles are arranged and the five parallel rows of individual electrodes 36 are arranged in a zigzag manner in the above-mentioned embodiments, the invention may be applied to at least one row of individual electrodes 36.

The invention is not limited to the above-mentioned embodiments but may be implemented in various modifications. For example, while the piezoelectric sheet has been used as the lowermost layer of the piezoelectric actuator 12, another insulating material may be used so long as it can transfer deformation of a piezoelectric sheet caused in another layer to the pressure chambers. Further, another insulating material may be used as the top sheet 35 or the restriction layer 46.

What is claimed is:

1. A laminated-type piezoelectric element comprising:
    a plurality of first electrode layers;
    a plurality of second electrode layers, the first electrode layers and the second electrode layers laminated alternately;
    a plurality of piezoelectric sheets, each of which is sandwiched between the first electrode layer and the second electrode layer, wherein:
    each of the first electrode layers defines a plurality of individual electrodes;
    each of the individual electrodes defined in one of the first electrode layers is electrically connected to counterpart individual electrodes of the others of the first electrode layers;
    the second electrode layers are electrically connected to each other;
    each of the individual electrodes has an elongated and substantially rectangle shape extending in a first direction;

the individual electrodes defined in each first electrode layer are arranged at predetermined intervals in a second direction perpendicular to the first direction, to form a row;

a common electrode defined in each second electrode layer includes a first portion having a band shape, the first portion extending to overlap the row of the individual electrodes when viewed in a plan view;

the first portion of the common electrode has a pair of edges extending to be perpendicular to a long side of the rectangle shape of each individual electrode;

the individual electrodes and the common electrodes at least partially overlap each other in a laminated direction, when viewed in the plan view; and both ends of each individual electrode in the first direction protrude to outer positions than the pair of edges of the first portion, when viewed in the plan view.

2. The laminated-type piezoelectric element according to claim 1, wherein:

each common electrode further includes a second portion different from the first portion having the band shape; and the common electrodes are electrically connected to each other in the second portions.

3. The laminated-type piezoelectric element according to claim 2, wherein each individual electrode has a width in the second direction, which is shorter than a length thereof in the first direction.

4. The laminated-type piezoelectric element according to claim 1, wherein:

the individual electrodes of each first electrode layer are arranged to form a plurality of rows; and the first portion of each common electrode includes a plurality of first portions corresponding to the plurality of rows of the individual electrodes.

5. The laminated-type piezoelectric element according to claim 1, wherein at least one of the edges of each first portion forms a boundary between the common electrode and a rectangle blank portion.

6. The laminated-type piezoelectric element according to claim 1, wherein each individual electrode includes at one end thereof a terminal protruding from one of the edges of the first portion when viewed in the plan view, the terminal electrically connected to another individual electrode in the laminated direction.

7. The laminated-type piezoelectric element according to claim 6, wherein two individual electrodes adjacent to each other in the second direction include the terminals protruding from the edges of the first portion in opposite directions alternately, when viewed in the plan view.

8. An inkjet recording head comprising:

a cavity unit including:
  a plurality of nozzles arranged to form a row extending in a second direction, the row of the nozzles arranged in a first direction perpendicular to the second direction; and
  a plurality of pressure chambers forming a row, the pressure chambers corresponding to the nozzle; and a laminated-type piezoelectric element joined to a rear face of the cavity unit, the piezoelectric element including:
  a plurality of first electrode layers;
  a plurality of second electrode layers, the first electrode layers and the second electrode layers laminated alternately;
  a plurality of piezoelectric sheets, each of which is sandwiched between the first electrode layer and the second electrode layer, wherein:

each of the first electrode layers define a plurality of individual electrodes;

each of the individual electrodes defined in one of the first electrode layers is electrically connected to counterpart individual electrodes of the others of the first electrode layers;

the second electrode layers are electrically connected to each other;

each of the individual electrodes has an elongated and substantially rectangle shape extending in the first direction;

the individual electrodes defined in each first electrode layer are arranged at predetermined intervals in the second direction to form a row;

a common electrode defined in each second electrode layer includes a first portion having a band shape, the first portion extending to overlap the row of the individual electrodes when viewed in a plan view;

the first portion of the common electrode of each second piezoelectric sheet has a pair of edges extending to be perpendicular to a long side of the rectangle shape of each individual electrode;

the individual electrodes and the common electrodes at least partially overlap each other in a laminated direction, when viewed in the plan view; and both ends of each individual electrode in the first direction protrude to outer positions than the pair of edges of the first portion, when viewed in the plan view.

9. The inkjet recording head according to claim 8, wherein:

each common electrode further includes a second portion different from the first portion having the band shape; and the common electrodes are electrically connected to each other in the second portions.

10. The inkjet recording head according to claim 9, wherein each individual electrode has a width in the second direction, which is shorter than a length thereof in the first direction.

11. The inkjet recording head according to claim 8, wherein:

the nozzles form a plurality of rows;

the pressure chambers form a plurality of rows;

the individual electrodes of each first electrode layer are arranged to form a plurality of rows; and the first portion of each common electrode includes a plurality of first portions corresponding to the plurality of rows of the individual electrodes.

12. The inkjet recording head according to claim 8, wherein at least one of the edges of each first portion forms a boundary between the common electrode and a rectangle blank portion.

13. The inkjet recording head according to claim 8, wherein each individual electrode includes at one end thereof a terminal protruding from one of the edges of the first portion when viewed in the plan view, the terminal electrically connected to another individual electrode in the laminated direction.

14. The inkjet recording head according to claim 13, wherein two individual electrodes adjacent to each other in the second direction include the terminals protruding from the edges of the first portion in opposite directions alternately, when viewed in the plan view.

15. A laminated-type piezoelectric element comprising:
a first electrode layer defining a plurality of individual electrodes;
a second electrode layer defining a common electrode;
a piezoelectric sheet sandwiched between the first electrode layer and the second electrode layer, wherein:
each of the individual electrodes has an elongated and substantially rectangle shape extending in a first direction;
the individual electrodes are arranged at predetermined intervals in a second direction perpendicular to the first direction, to form a row;
the common electrode includes a band-shape portion extending in the second direction to overlap the row of the individual electrodes when viewed in a plan view;
the band-shape portion of the common electrode has a pair of edges extending in the second direction; and
both ends of each individual electrode in the first direction protrude to outer positions than the pair of edges of the band-shape portion, when viewed in the plan view.

* * * * *